(12) United States Patent
Standing

(10) Patent No.: US 6,677,669 B2
(45) Date of Patent: Jan. 13, 2004

(54) SEMICONDUCTOR PACKAGE INCLUDING TWO SEMICONDUCTOR DIE DISPOSED WITHIN A COMMON CLIP

(75) Inventor: Martin Standing, Tonbridge (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/053,123

(22) Filed: Jan. 18, 2002

(65) Prior Publication Data

US 2003/0137040 A1 Jul. 24, 2003

(51) Int. Cl.[7] .................... H01L 23/34; H01L 23/02; H01L 23/28; H01L 23/12; H05K 7/20
(52) U.S. Cl. .................. 257/685; 257/777; 257/723; 257/724; 257/699; 257/712; 257/713; 257/730; 257/731; 257/727; 257/678; 257/726; 257/775; 257/773; 257/732; 174/522; 361/760; 361/762; 361/772; 361/792; 361/795; 29/854; 29/856
(58) Field of Search .................. 257/685, 723, 257/724, 678, 729, 733, 786, 699, 775, 727, 680, 774, 773, 706, 712, 713, 684, 776, 675, 717, 720, 686; 174/52.2; 361/760, 762, 772, 792, 795; 29/854, 856

(56) References Cited

U.S. PATENT DOCUMENTS

| 3,784,726 | A | * | 1/1974 | Smith et al. ................ 174/525 |
| 5,536,972 | A | * | 7/1996 | Kato ............................ 257/706 |
| 5,639,990 | A | * | 6/1997 | Nishihara et al. ........... 174/52.2 |
| 5,754,402 | A | * | 5/1998 | Matsuzaki et al. .......... 257/713 |
| 5,814,884 | A | * | 9/1998 | Davis et al. ................. 257/723 |
| 5,929,519 | A | * | 7/1999 | Mori et al. .................. 257/724 |
| 6,075,289 | A | * | 6/2000 | Distefano .................... 257/732 |
| 6,184,585 | B1 | * | 2/2001 | Martinez et al. ............ 257/777 |
| 6,479,889 | B1 | * | 11/2002 | Yoshida et al. ............. 257/678 |
| 2001/0048116 | A1 | * | 12/2001 | Standing et al. ............ 257/177 |
| 2002/0109211 | A1 | * | 8/2002 | Shinohara .................... 257/666 |

FOREIGN PATENT DOCUMENTS

| JP | 64-81346 | * | 3/1989 | ................. 257/699 |
| JP | 5-175384 | * | 7/1993 | ................. 257/699 |

* cited by examiner

*Primary Examiner*—Alexander O. Williams
(74) *Attorney, Agent, or Firm*—Ostrolenk, Faber, Gerb & Soffen, LLP

(57) ABSTRACT

A co-package semiconductor device including an outer clip in the form of a metal can includes also two semiconductor dies, at least one of which uses the outer clip as an electrical connector. An inner clip is used to dispose one of the dies within the outer clip. The inner clip may be insulated from the outer clip by an insulating layer.

24 Claims, 4 Drawing Sheets

SEMICONDUCTOR PACKAGE INCLUDING TWO SEMICONDUCTOR DIE DISPOSED WITHIN A COMMON CLIP

BACKGROUND OF THE INVENTION

The present invention relates to semiconductor devices and more particularly to a semiconductor device including at least two co-packaged semiconductor dies.

Co-packaged devices, commonly referred to as copaks, are well known. Typically, such devices include two or more identical or different semiconductor devices that are packaged in a common housing. The benefit achieved by such an arrangement is a more compact electronic package which occupies less space on the circuit board than would be consumed by individually packaged semiconductor dies used for the same function within a circuit. This saving in space naturally allows for construction of a more compact device and/or more complicated devices having more electronic parts in the same space.

Many copak devices include a molded housing and a lead frame. The housing provides protection for the semiconductor dies against environmental elements such as moisture, while the lead frame is used to-connect the semiconductor dies to external elements within a circuit. This conventional arrangement requires, therefore, several parts which not only add to the cost of the copak, but also complicate its manufacturing. It is, therefore, desirable to have a copak device having two or more devices contained therein, while reducing the number of parts required for its assembly.

SUMMARY OF THE INVENTION

A semiconductor device according to the present invention includes at least two identical or dissimilar semiconductor dies. The two semiconductor dies are co-packaged within a common outer metal clip which may serve as an external connector for at least one of the semiconductor dies.

According to the first aspect of the invention, two identical or dissimilar semiconductor dies are contained within an outer clip, which serves both as a housing for the dies and an electrical connector for connecting one of the dies to external elements in an electronic circuit.

Specifically, a co-packaged semiconductor device according to the invention includes a metal can having a substantially flat web portion and a plurality of walls defining a space. A first semiconductor die, which may be a MOSFET, is connected electrically at its drain electrode to the web portion by a conductive layer, which may be a layer of solder or conductive epoxy. Two raised portions extending from edges of two opposing walls of the outer clip make connection to corresponding electrical pads on a substrate such as a circuit board, thereby connecting the drain electrode of the MOSFET to its appropriate place within an electronic circuit.

A second semiconductor die is disposed within an inner clip, which clip is connected to but insulated from the web portion of the outer clip by an insulation layer. The second semiconductor die may be a MOSFET identical to the first semiconductor die, or an integrated circuit formed on a semiconductor chip for controlling the operation of the first semiconductor die.

According to the first aspect of the present invention, the thickness of the first semiconductor die and the total height of the inner clip and the second semiconductor die are equal such that their respective top surface, are coplanar with one another, and preferably coplanar with contact surfaces of the raised portions. To achieve this result, the second semiconductor die may be ground to reduce its thickness.

The inner clip according to the present invention includes a bottom plate and a plurality of walls extending substantially vertically from the edges of the bottom plate. At least one of the walls of the inner clip includes an extended portion which is bent to define a contact surface that is preferably coplanar with the raised portions of the outer clip. The contact surface of the inner clip makes contact with an appropriate pad on a substrate to connect the second semiconductor die to its position within an electronic circuit. Preferably, the exterior surface of the inner clip is chemically treated to create an insulated surface, or insulated by an electrically insulating polymer layer, such as polyimide. The interior surface of the inner clip is preferably coated with a highly conductive metal such as silver. The inner clip can be formed by raising the edges of a copper foil to create substantially vertical walls that at least partially receive the second semiconductor die.

A co-packaged semiconductor device according to the second embodiment of the present invention includes an outer clip which may be a metal can substantially similar to the one used in the first embodiment. The semiconductor device according to the second embodiment includes at least two identical or dissimilar semiconductor dies each having at least one of its major electrodes connected electrically to the web portion of the outer clip by a conductive layer of solder or conductive epoxy. In this embodiment, the outer clip serves both as a housing for the semiconductor dies and a connector for connecting the devices to an external element within an electronic circuit.

Other features and advantages of the present invention will become apparent from the following description of the invention which refers to the accompanying drawings.

BRIEF DESCRIPTION OF THE DRAWING(S)

DETAILED DESCRIPTION OF THE DRAWINGS

Figure 1:
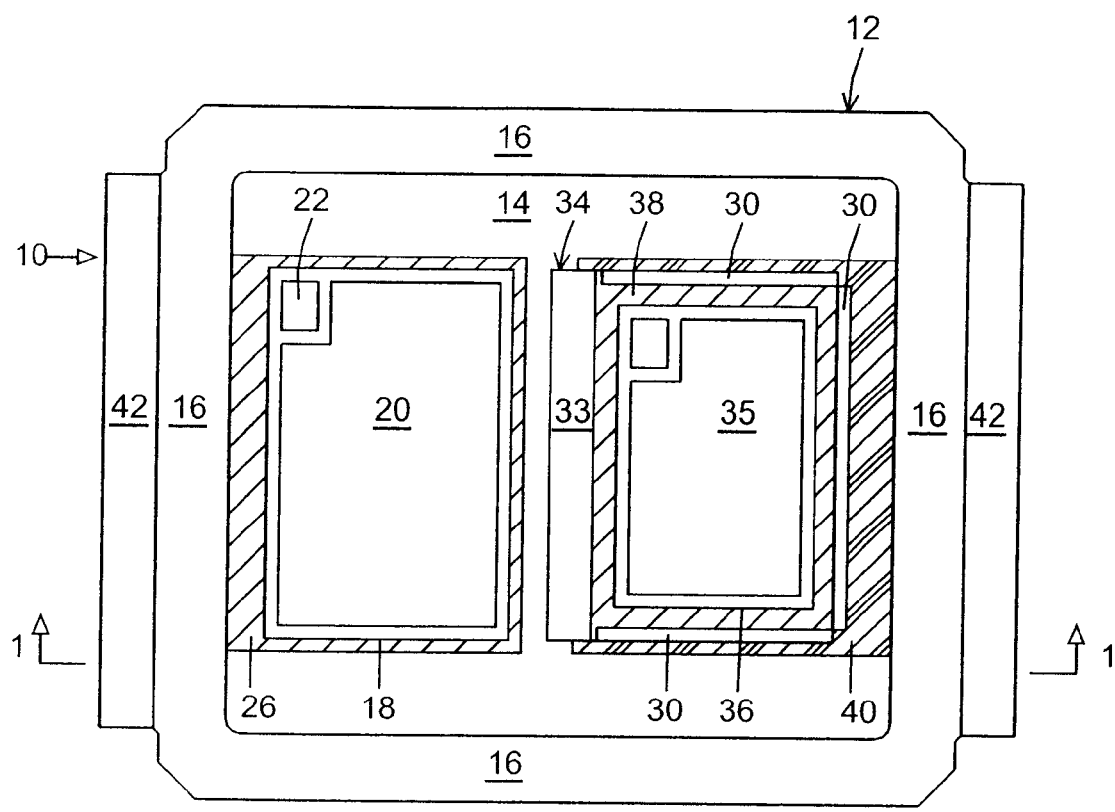
FIG. 1 shows a top plan view of a semiconductor device according to the first embodiment of the present invention.

FIG. 1 shows semiconductor device 10 according to the first embodiment of the present invention. Semiconductor device 10 includes an outer conductive clip 12. Outer conductive clip 12 is a metal can which includes web portion 14 and a plurality of walls 16 which extend from the edges of web portion 14 to define a space. Outer clip 12 may be made from copper and preferably coated with silver. First semiconductor die 18 is disposed within the space defined by walls 16 of outer conductive clip 12. First semiconductor die 18 may be a vertical conduction MOSFET, power diode, IGBT or the like. In the first embodiment of the present invention, first semiconductor device 18 is a vertical conduction MOSFET having source electrode 20, gate electrode 22 and drain electrode 24 (FIG. 2).

Figure 2:
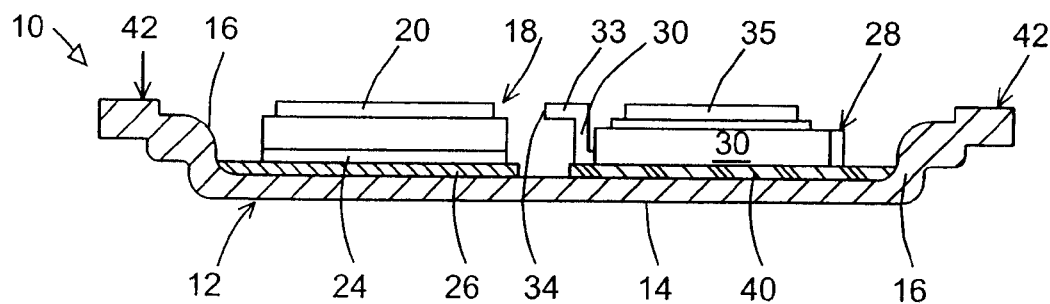
FIG. 2 shows a cross-sectional view of the first embodiment of the present invention looking in the direction of line 2—2 in FIG. 1.

Referring to FIG. 2, drain electrode 24 of first semiconductor die 18 is electrically connected to web portion 14 of outer conductive clip 12 by a layer of conductive material 26, which may be solder or a conductive epoxy. Semiconductor device 10 according to the first embodiment also includes an inner clip 28 disposed within the space defined by walls 16 of outer clip 12.

Figure 3:
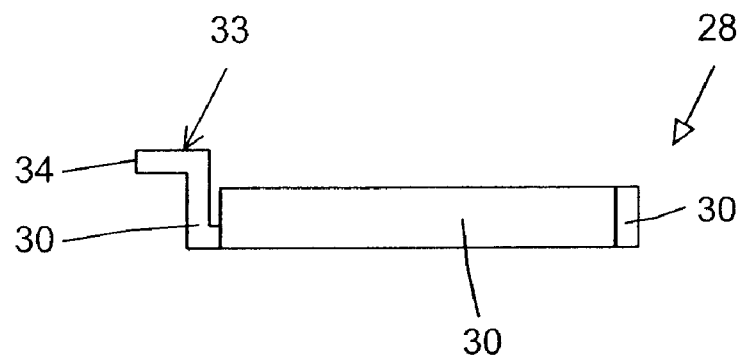
FIG. 3 is a side plan view of an inner clip according to an aspect of the present invention.
Figure 4:
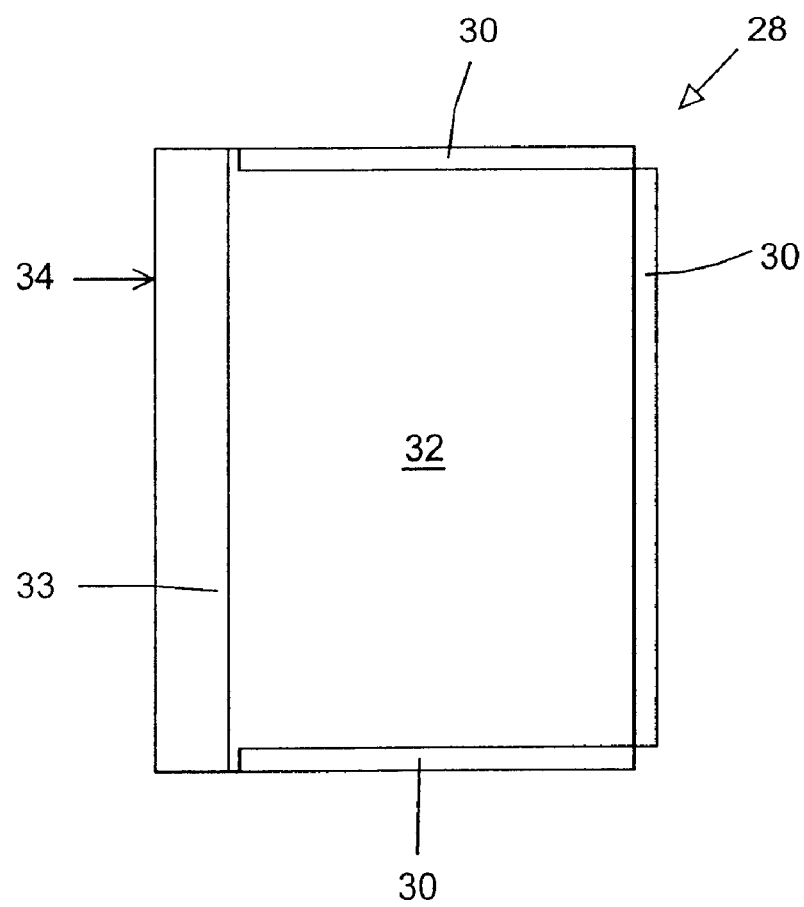
FIG. 4 is a top plan view of the inner clip shown in FIG. 3.

Referring to FIGS. 3 and 4, inner clip 28 is preferably made from a thin conductive sheet of metal such as a sheet of copper and includes preferably vertically extending walls 30 that define a space around its bottom plate portion 32. Inner clip 28 also includes an extended portion 34 that extends from an edge of one of walls 30 of clip 28 and is bent to provide a contact surface 33. The interior surface of inner clip 28 may be coated with a highly conductive material such as silver, and its outer surface may be chemically treated to be made insulative or covered with an insulating adhesive film such as polyimide. Inner clip 28 is preferably made by raising the outer edges of a thin copper foil to form walls 30. One of the walls so formed should have extended portion 34 which is then outwardly bent to expose an inner surface of extended portion 34 as contact surface 33. The copper foil used to form inner clip 28 should be thinner than the depth of outer clip 12. In a preferred embodiment, for example, a copper foil of about 0.100 mm thickness is used where outer clip 12 has a depth of about 0.396 mm.

Referring now to FIGS. 1 and 2, second semiconductor die 36 resides in the space within walls 30 of inner clip 28. In the first embodiment, second semiconductor die may be a MOSFET, having a drain electrode 37 electrically connected to inner clip 28 by a conductive layer 38, which may be solder or a conductive epoxy, such as a silver-loaded epoxy. Walls 30 of inner clip 28 act as dams to prevent solder or the conductive epoxy from spilling onto and making contact with web portion 14 of outer clip 12. Second semiconductor die 36 is insulated from outer clip 12 by an insulating layer 40 that is disposed between the bottom of inner clip 28 and web portion 14 of outer clip 12. In a preferred embodiment first semiconductor die 18 has a thickness of about 0.350, which is raised to the top of the depth of outer clip 12 by conductive material 26. Second semiconductor die 36 is also raised inside inner clip 28 so that its top surface will be coplanar with the top surface of first semiconductor die 18. To obtain this result it may be necessary to use a die that is thinner than first semiconductor die 18. In a preferred embodiment, second semiconductor die 36 is 0.200 mm thick. To achieve this thickness, the back of a die may be ground to the desired thickness before it is ready to be placed in inner clip 28.

Figure 7:
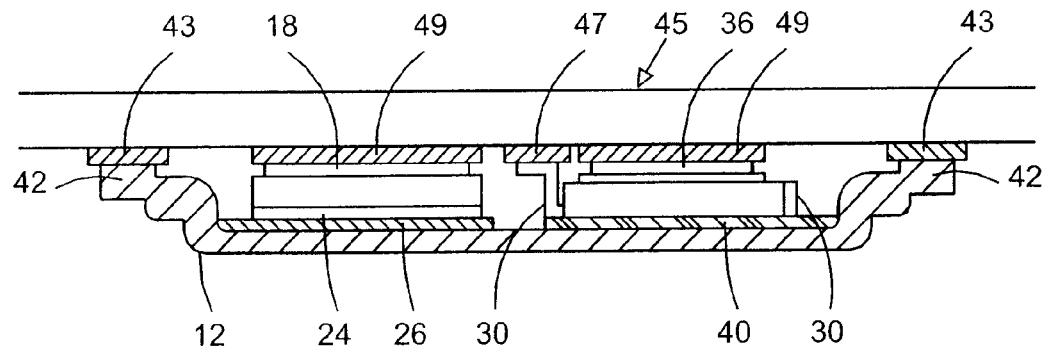
FIG. 7 shows a semiconductor device according to the first embodiment of the present invention connected to a substrate.

Referring to FIG. 7, according to an aspect of the present invention, outer clip 12 includes at least two raised portions 42 which rise from the edges of two opposing walls of outer clip 12. Each raised portion 42 has a flat contact surface for making electrical contact with corresponding electrical pads 43 on a substrate 45, such as a circuit board or an Insulated Metal Substrate. Through raised portions 42, drain electrode 24 of first semiconductor die 18 is connected electrically to its appropriate place within an electronic circuit. Hence, outer clip 12 serves as both housing and electrical connector for first semiconductor die 12.

In semiconductor device 10 according to the first embodiment, contact surface 33 of extended portion 34, source electrode 20 of first semiconductor die 18 and source electrode 35 of second semiconductor die 36 are coplanar with contact surfaces of raised portions 42 of outer clip 12. Contact surface 33 connects the drain electrode of second semiconductor die 36 to an appropriate conductive pad 47 on a substrate 45 to connect the drain electrode of second semiconductor die 36 to its appropriate position within an electronic circuit.

Figure 5:
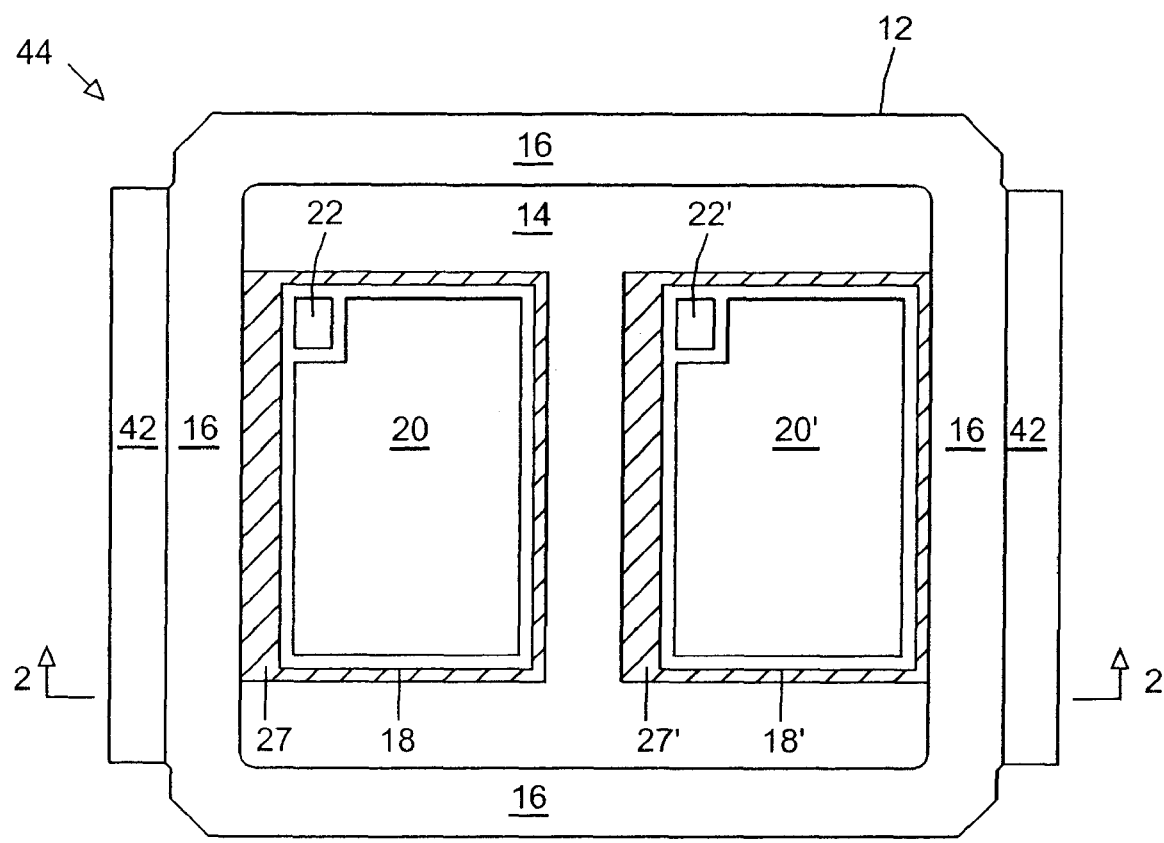
FIG. 5 is a top plan view of a semiconductor device according to the second embodiment of the present invention.
Figure 6:
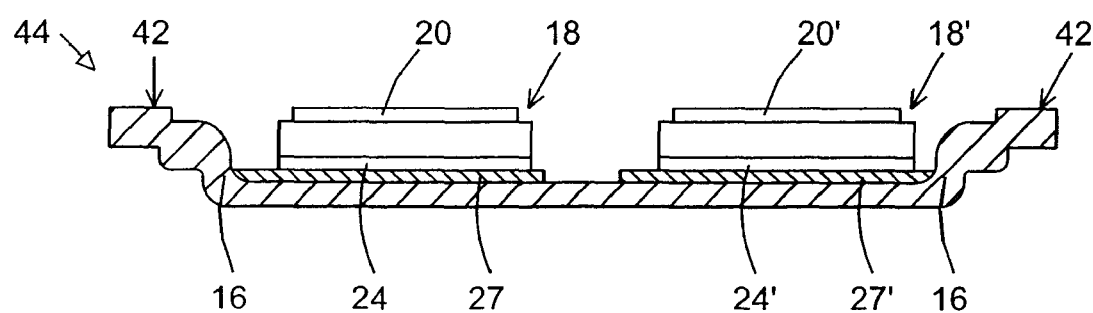
FIG. 6 is a cross-sectional view of the second embodiment of the present invention looking in the direction of line 2—2 in FIG. 5.
Figure 8:
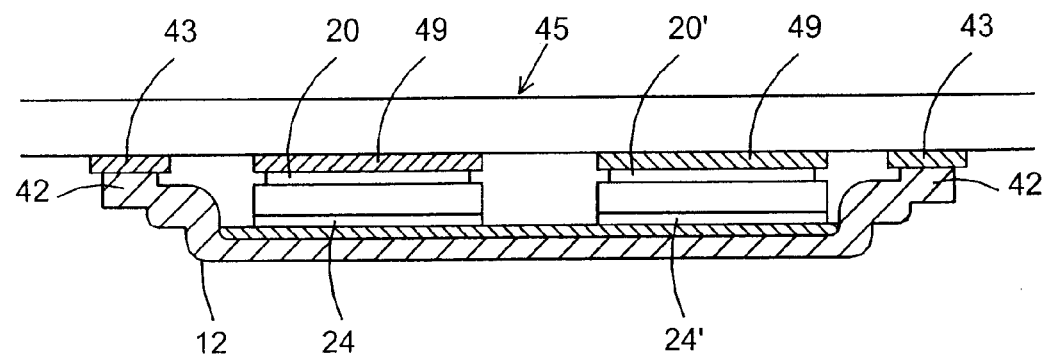
FIG. 8 shows a semiconductor device according to the second embodiment of the present invention connected to a substrate.

FIGS. 5 and 6, in which like numerals identify like features, show semiconductor device 44 according to the second embodiment of the present invention. Semiconductor device 44 according to the second embodiment includes first and second semiconductor devices 18, 18' which may be MOSFETs. However, power diodes, IGBTS, and the like may be also used instead of MOSFETs. Drain electrodes 24, 24' of first and second semiconductor devices 18, 18' are electrically connected to web portion 14 of outer clip 12 by a conductive layer 27, 27'. A common conductive layer may also be used instead of independent conductive layers 27, 27'. Conductive layers 27, 27' may be layers of solder or conductive epoxy such as a silver-loaded epoxy. Source electrodes 20, 20' of first and second semiconductor devices 18, 18' are coplanar with one another and preferably coplanar with raised portions 42 of outer clip 12. In the second embodiment, outer clip 12 serves as a housing as well as a common connector for drain electrodes 24, 24' of the semiconductor die. As shown in FIG. 8, raised portions 42 make electrical contact with pads 43 on substrate 45 to connect drain electrodes 24, 24' of the dies to their appropriate place within an electronic circuit. Source electrodes 20, 20' of the dies are also in electrical contact with pads 49 on substrate 45 and thus connect source electrodes 20, 20' to their appropriate place within the circuits as shown in FIGS. and 8.

One skilled in the art would appreciate that the present invention can be practiced by a variety of combination of semiconductor dies using the inventive concepts disclosed herein and demonstrated by way of examples with reference to the embodiments described. For example, in the first embodiment second semiconductor die 36 may be replaced with a schottky diode or a control IC for controlling first semiconductor die 18.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A co-packaged semiconductor device comprising:
   an outer conductive clip having a web portion and a plurality of walls extending from the edges of the web portion to define a space;
   a first semiconductor die having at least two major electrodes each disposed on a respective major surface of said first semiconductor die;
   a conductive layer electrically connecting one of said major electrodes to said web portion;
   an inner clip having a plurality of walls and disposed within said space and on said web portion;

a second semiconductor die disposed at least partially within said inner conductive clip.

2. A co-packaged semiconductor device according to claim 1, wherein said outer conductive clip includes two raised portions extending from edges of two of its opposing walls, each raised portion including a contact surface for making electrical contact with a corresponding electrical contact pad on a substrate.

3. A co-packaged semiconductor device according to claim 2, wherein said inner clip includes a portion extending from at least one of its walls that is coplanar with said contact surfaces of said two raised portions of said outer conductive clip.

4. A co-packaged semiconductor device according to claim 1, wherein said inner clip is connected to but insulated from said web portion.

5. A co-packaged semiconductor device according to claim 1, wherein said first and second semiconductor dies are MOSFETs.

6. A co-packaged semiconductor device according to claim 1, wherein said first semiconductor die is a MOSFET having a drain electrode connected to said web portion, and said second semiconductor die is an integrated circuit for controlling said MOSFET.

7. A co-packaged semiconductor device according to claim 1, wherein said inner clip is made from copper.

8. A co-packaged semiconductor device according to claim 1, wherein an outer surface of said inner conductive clip is insulated.

9. A co-packaged semiconductor device according to claim 1, wherein an interior surface of said inner clip is coated with silver.

10. A co-packaged semiconductor device according to claim 1, further comprising an insulating layer connecting said inner clip to said web portion.

11. A co-packaged semiconductor device according to claim 1, wherein said second semiconductor die is thinner than said first semiconductor die.

12. A co-packaged semiconductor device according to claim 1, wherein said second semiconductor die is electrically connected to said inner clip by a conductive epoxy.

13. A co-packaged semiconductor device according to claim 1, wherein said outer conductive clip is a metal can.

14. A co-packaged semiconductor device according to claim 13, wherein said metal can comprises copper.

15. A semiconductor device according to claim 13, wherein said metal can is coated with a layer of silver.

16. A co-packaged semiconductor device comprising:
a metal can having a substantially planar web portion and a plurality of walls surrounding said web portion;
a first semiconductor die having at least two major electrodes each disposed on a respective major surface of said first semiconductor die;
a second semiconductor die having at least two major electrodes each disposed on a respective major surface of said second semiconductor die; and
respective conductive layers disposed between and electrically connecting said web portion to said first major electrodes of said first and second semiconductor dies;
wherein said second major electrodes of said first and second semiconductors dies are substantially coplanar.

17. A semiconductor device according to claim 16, wherein said first and second semiconductor dies are MOSFETs.

18. A semiconductor device according to claim 16, wherein said metal can further comprises at least two raised portions extending from respective opposing walls of said can, said raised portions having contact surfaces that are coplanar with said second major electrodes of said first and second semiconductor dies.

19. A co-packaged semiconductor device comprising:
an outer clip having a web portion and a plurality of walls extending from the edges of the web portion to define a space, at least one of said walls having a surface that can make electrical contact with an electrical pad on a substrate;
at least two semiconductor dies residing within said space, each semiconductor die having at least two opposing major electrodes;
wherein at least one of said semiconductor dies has one electrode electrically connected to said web portion, and its opposing electrode free to make electrical contact with a corresponding electrical pad on a substrate and coplanar with an electrode of the other semiconductor die which is also free to make electrical contact with a corresponding electrical pad on a substrate.

20. The co-package semiconductor device of claim 19, wherein both said semiconductor dies have an electrode electrically connected to said web portion.

21. The co-package semiconductor device of claim 19, wherein said outer clip includes raised portion extending from edges of at least two of its opposing walls.

22. The co-packaged semiconductor device of claim 19, further comprising an inner clip disposed within said space, wherein at least one of said semiconductor dies is disposed in said inner clip.

23. The co-packaged semiconductor device of claim 22, wherein said inner clip is disposed on but insulated from said web portion.

24. The co-package semiconductor device of claim 22, wherein said inner clip includes a plurality of walls acting as dams to retain conductive material disposed within said clip, and an extended portion extending from at least one of said walls, said extended portion having an electrical contact surface for making contact with an electrical pad on a substrate.

* * * * *